(12) United States Patent
Kok

(10) Patent No.: US 11,271,529 B1
(45) Date of Patent: Mar. 8, 2022

(54) HARMONIC MATCHING NETWORK FOR INCREASING PERFORMANCE IN CLASS-F POWER AMPLIFIERS

(71) Applicant: QUINSTAR TECHNOLOGY, INC., Torrance, CA (US)

(72) Inventor: Yon-Lin Kok, Cerritos, CA (US)

(73) Assignee: QUINSTAR TECHNOLOGY, INC., Torrance, CA (US)

( * ) Notice: Subject to any disclaimer, the term of this patent is extended or adjusted under 35 U.S.C. 154(b) by 0 days.

(21) Appl. No.: 17/390,801

(22) Filed: Jul. 30, 2021

(51) Int. Cl.
    *H03F 1/56* (2006.01)
    *H03F 3/217* (2006.01)

(52) U.S. Cl.
    CPC .............. *H03F 1/56* (2013.01); *H03F 3/217* (2013.01); *H03F 2200/222* (2013.01); *H03F 2200/387* (2013.01); *H03F 2200/451* (2013.01)

(58) Field of Classification Search
    CPC ...... H03F 1/56; H03F 3/217; H03F 2200/222; H03F 2200/387; H03F 2200/451
    USPC .......................................................... 330/251
    See application file for complete search history.

(56) References Cited

U.S. PATENT DOCUMENTS

| | | | | | |
|---|---|---|---|---|---|
| 4,717,884 | A | * | 1/1988 | Mitzlaff | H03F 3/217 330/251 |
| 5,818,880 | A | * | 10/1998 | Kriz | H04L 27/12 375/306 |
| 2015/0311874 | A1 | * | 10/2015 | Samelis | H04B 1/006 455/95 |
| 2015/0381140 | A1 | * | 12/2015 | Embar | H03H 7/383 333/33 |
| 2021/0152140 | A1 | * | 5/2021 | Wang | H01P 3/081 |

OTHER PUBLICATIONS

Shuoqi Chen, Larry Witkowski and Xing Gu, "Important Recent Advancement of GaN Technology and MMICS for W-Band Applications," ECS Transactions, 2017, pp. 945-952 vol. 80, No. 10.
J.M. Schellenberg, B. Kim, and T. Phan, "W-Band, Broadband 2W GaN MMIC," 2013 IMS Digest, Jun. 2013, IEEE.
D. Schmelzer and S.I. Long, "A GaN HEMT Class F Amplifier At 2 GHZ With >80% PAE," IEEE JSSC, vol. 42, No. 10, Oct. 2007.
J. Schellenberg, A. Tran, L. Bui, A. Cuevas and E. Watkins, "37W, 75-100 GHZ GaN Power Amplifier," IMS2016, IEEE.
J. Schellenberg, "A 2-W, W-Band GaN Traveling-Wave Amplifier With 25 GHZ Bandwidth," Sep. 2015, pp. 2833-2840, IEEE Trans. Microwave Theory Tech., vol. MTT- 63.

(Continued)

*Primary Examiner* — Hafizur Rahman
(74) *Attorney, Agent, or Firm* — Lazaris IP

(57) ABSTRACT

A Class-F power amplifier includes a harmonic matching network topology comprised of circuit elements configured relative to an output network of the power amplifier. The harmonic matching network topology suppresses higher-order harmonics in such a power amplifier and includes coupled-line capacitors and open-stubs that introduce harmonic terminations in the output network, and quarter-wavelength transmission lines to match an overall network to a 50-ohm output load. The harmonic matching network topology enables the power amplifier to exhibit desired performance characteristics in specific frequency ranges for high-power applications.

21 Claims, 4 Drawing Sheets

(56) References Cited

OTHER PUBLICATIONS

A. Brown, K. Brown, J. Chen, K. C. Hwang, N. Kolias, and R. Scott, "W-Band GaN Power Amplifier MMICS," In IEEE Mtt-S Int. Microw. Symp. Dig., Jun. 2011.

J. Chéron, M. Campovecchio, R. Quéré, D. Schwantuschke, R. Quay and O. Ambacher, "High-Efficiency Power Amplifier MMICS in 100 NM GaN Technology at KA-Band Frequencies," 2013 EUMC Proceedings, Oct. 2013.

* cited by examiner

HARMONIC MATCHING NETWORK FOR INCREASING PERFORMANCE IN CLASS-F POWER AMPLIFIERS

FIELD OF THE INVENTION

The present invention relates to radio frequency and microwave power electronics systems. Specifically, the present invention relates to a harmonic matching network that maximizes output power of Class-F power amplifiers and enables performance increases such as power added efficiency (PAE) for use in wide-bandwidth or broadband applications.

BACKGROUND OF THE INVENTION

Power amplifiers are devices commonly used to amplify and combine signals in electronics systems. The output power and the efficiency of a power amplifier are usually the performance index used to measure the quality of the amplifier. Current microfabrication technologies make it possible to monolithically produce power amplifier circuits at microwave frequencies (300 MHz to 300 GHz) on GaAs, SiC and silicon substrates.

Power amplifiers are typically classified according to a time period that the amplifier device is conducting current, indicated as a portion of the period of a signal as applied to the input. For example, a Class A amplifier is conducting through the entire period of the signal, whereas a Class B amplifier is conducting only for one-half of the input period. In other power amplifier classes, amplifier design becomes more intricate according to the desired output and the complexity of stages and devices comprising the overall network, such as in a Class D amplifier that operates in a switching manner where pulse-width modulation is applied to control the output.

Class F power amplifiers are useful in high-frequency, high-power applications such as satellite communications, but exhibit imperfections due to harmonics produced by transistor nonlinearities. Class-F power amplifiers also operate in switching modes, where the current and voltage waveforms differ in phase by 180°, to minimize transistor-driven power dissipation; in such modes these harmonics need to be suppressed to achieve desired output power and power added efficiency (PAE) characteristics. Such harmonics render Class F power amplifiers difficult to implement at certain frequencies and using certain substrate materials on which circuit elements comprising the amplifiers are fabricated, and existing designs are not able to provide output characteristics such as a high output power in the fundamental frequency and delivered with a high PAE that are required for particular applications such as in microwave power electronics.

Existing designs, such as a single-MMIC power amplifier, can only achieve either an output power of more than 2 W, or a power added efficiency of more than 20%, but not both, in the same application. Existing techniques for simultaneously maximizing both output power and efficiency in a power amplifier include load-pulling the device to vary impedance across the overall network to find the optimum matching impedance of the amplifier, but such a technique does not fully address the impact of harmonics. Alternatively, designers attempt to overcome harmonics by incorporating circuit topologies that provide single-ended, balanced, cascaded, push-pull, and differential configurations. Still further, design choices including operating Class A, B, C, D or E amplifiers at the desired frequency bands instead of Class F designs to address the need for power and efficiency in electronics systems. However, none of these existing strategies are able to meet the power output and efficiency needs of certain high-frequency microwave applications.

Advances in applications for power electronics systems such as in communications satellites require high-power and high-efficiency devices that are capable of operating in frequency ranges from Ka-band to W-band (i.e., from 30 GHz to 100 GHz). Due to limited prime power available to systems in remote operating environments, power amplifier efficiency is becoming an increasingly prime design consideration. Additionally, advancements in semiconductor materials upon which integrated circuits (such as those for power amplification systems) are fabricated, such as gallium arsenide (GaAs), and gallium nitride on silicon carbide (GaN-on-SiC), are more cost-effective and exhibit characteristics of performance improvement that make it more suitable than other materials for high-power components, such as for example higher breakdown voltage and better electrical resistivity. However, currently-available GaN-based MMIC power amplifiers that operate at V-band frequencies (i.e., in the range of 59 Ghz to 71 GHz) are only able to achieve a maximum PAE of less than 20% at the required power output for operation at such frequencies.

Additionally, in existing techniques for impedance transformation, RF short-circuits can be realized with open-ended quarter-wavelength transmission lines, and RF open-circuit can be created with shunt inductors. However, the sizes of the circuit elements for such short-circuit and open-circuit conditions are usually too large or too small to be realized in MMIC fabrication in millimeter wave frequencies (30 GHz to 100 GHz).

Accordingly, there is a need for improvements in the design of existing Class F power amplifiers that exhibit desired high-power performance characteristics within specific frequency ranges. There is a further need in the art for power amplifiers for use in power electronics systems that produce output power of more than 2 W, and which at the same time exhibit a power added efficiency (PAE) of more than 20%. There is still a further need in the art for power amplifiers having device configurations which can be fabricated on wafers that are most cost effective and enable other performance improvements desired for high-power applications, and which are able to achieve both a power output greater than 2 W, and a power added efficiency (PAE) of more than 20% within specific microwave frequency bands.

BRIEF SUMMARY OF THE INVENTION

The present invention is a topology for utility in power amplifier circuit designs that presents a harmonic matching network for suppressing higher-order harmonic powers and for promoting optimal fundamental power and efficiency within desired frequency bands. The topology includes a tuner comprised of coupled-line capacitors and open-stubs that introduce equivalent short-circuit and open-circuit conditions, and an impedance transformer in which quarter-wavelength transmission lines match an impedance of the overall network to a 50-ohm input/output load. The topology enables harmonic terminations of the 2nd and 3rd harmonic frequencies while at the same time ensuring an optimal impedance match for both power and efficiency at the fundamental frequency. Such a topology is applicable within the V-band frequency range (59 GHz to 71 GHz) in Class-F power amplifier design, and in the broader frequency ranges from Ka-band to W-band (i.e., from 30 GHz to 100 GHz), and is further suitable for foundry fabrication using gallium arsenide (GaAs), and gallium nitride on silicon carbide (GaN-on-SiC) technology.

More specifically, the topology of the present invention creates equivalent 2nd harmonic short-circuit and 3rd harmonic open-circuit conditions, which enable operation of Class-F power amplifiers in switching modes. These equivalent 2nd harmonic short-circuit and 3rd harmonic open-circuit conditions produce harmonic terminations that realize more than 30 dBc and 50 dBc harmonic suppression to the 2nd and the 3rd harmonics, respectively. Further, the topology is applicable over a broader band of millimeter wave frequencies (30 GHz to 100 GHz), and as noted above are realizable with micro-fabrication technologies based on CMOS, GaAs, and GaN-based wafers, such as for example on a 2-mil SiC substrate using a GaN-based MMIC fabrication. The topology also makes it possible to realize a MMIC power amplifier with output power greater than 2.5 W, and an associated PAE greater than 30% at frequencies between 30 GHz and 100 GHz, and further enables a compact layout of a 3-stage power amplifier with die size less than 8.5 mm.

Applications such as communication satellite missions require high-efficiency power amplifiers, operating from the Ka-band to W-band (i.e. the range of 30 GHz to 100 GHz above). Due to limited power available with remote systems in such missions, power amplifier efficiency is a prime system consideration. Current state-of-the-art GaN-based MMIC power amplifiers operating at V-band frequencies can only achieve a PAE of about 20% with the required power. The invention of the harmonic matching network topology provides an effective means to design power amplifiers that include GaN-based MMICs that meet the goals of high output power (>2 W) and simultaneously high PAE (>30%). The harmonic matching network topology of the present invention therefore solves the problem of a lack of sufficient solid-state power amplifier designs exhibiting both high PAE and high output power for microwave and other applications.

It is therefore one objective of the present invention to provide an approach to power amplifier design that achieves specific performance characteristics for power electronics applications. It is another objective of the present invention to provide an approach to power amplifier design that achieves specific performance characteristics at desired operating frequencies.

It is a further objective of the present invention to provide a topology and circuit that suppresses higher-order harmonic powers in Class-F power amplifiers. It is still a further objective of the present invention to provide a topology and circuit that introduces harmonic terminations to accomplish suppression of higher-order harmonic powers in Class-F power amplifiers. It is yet another objective of the present invention to provide a topology and circuit that introduces harmonic terminations to accomplish suppression of higher-order harmonic powers in Class-F power amplifiers, and which exhibits performance characteristics of high output power (>2 W) and simultaneously high PAE (>30%), and at the same time is suitable for foundry fabrication using gallium nitride (GaN), and gallium nitride on silicon carbide (GaN-on-SiC) technology.

Other objects, embodiments, features and advantages of the present invention will become apparent from the following description of the embodiments, taken together with the accompanying drawings, which illustrate, by way of example, the principles of the invention.

BRIEF DESCRIPTION OF THE SEVERAL VIEWS OF THE DRAWINGS

The accompanying drawings, which are incorporated in and constitute a part of this specification, illustrate several embodiments of the invention and together with the description, serve to explain the principles of the invention.

DETAILED DESCRIPTION OF THE INVENTION

In the following description of the present invention reference is made to the exemplary embodiments illustrating the principles of the present invention and how it is practiced. Other embodiments will be utilized to practice the present invention and structural and functional changes will be made thereto without departing from the scope of the present invention.

The present invention is a harmonic matching network topology 110, and corresponding elements of a circuit embodying such a topology 110, that is focused at an output matching network of an output stage for power amplifiers, such as Class-F power amplifiers, to achieve desired output power and power added efficiency characteristics at certain frequencies. The present invention includes coupled-line capacitors to terminate 2nd harmonic powers, open-stubs to terminate 3rd harmonic powers, and quarter-wavelength transmission lines to ensure an impedance match between the input port(s) and the output port(s) (i.e. a 50-Ohm output load) with the overall network containing the $2^{nd}$ and $3^{rd}$ harmonic terminations, with minimal impact to the fundamental power. The present invention produces an effective suppression of the higher order harmonic powers, and the power amplifier's output power and PAE can be maximized within a compact MMIC (Monolithic Microwave Integrated Circuit) layout. The present invention is applicable for V-band frequencies (59 GHz to 71 GHz) and for broader millimeter frequencies between 30 GHz and 100 GHz. The present invention enables power amplifiers to deliver an output power of more than 2 W with a maximum PAE of 30% over the band of 59 to 65 GHz. For the band from 65 GHz to 71 GHz, the present invention enables an output power more than 2.5 W with an associated PAE of more than 30% using the same harmonic matching network topology 110 described herein.

Figure 1:
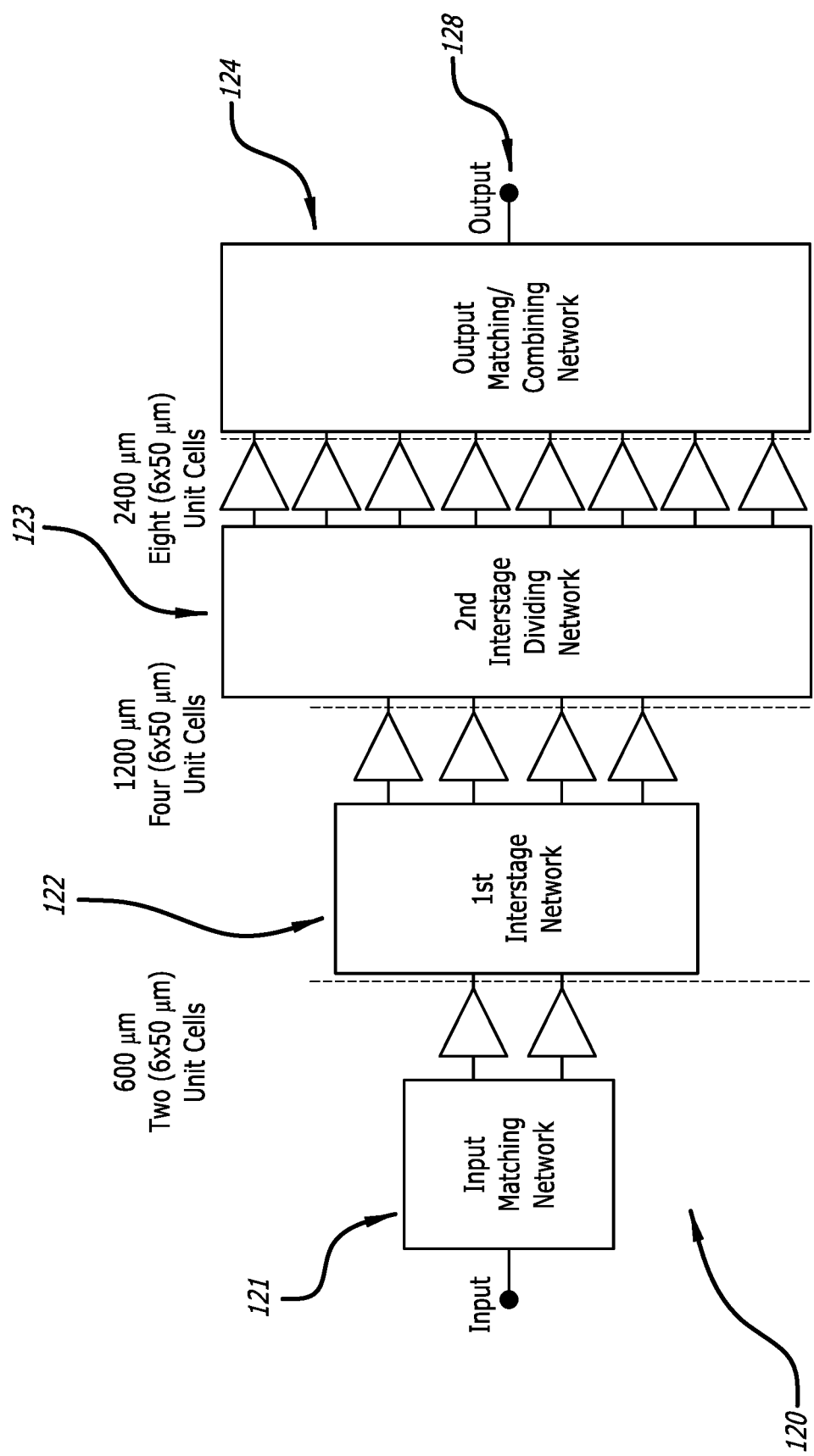
FIG. 1 is a block diagram of a power amplifier system having a harmonic matching network topology according to the present invention.

FIG. 1 is a systemic block diagram of an exemplary multi-stage power amplifier 120 according to one embodiment of the present invention, in which a circuit having circuit elements embodying a harmonic matching network topology 110 is deployed to tune higher-order harmonic powers propagating through an overall network 125 (shown in FIG. 2) of system comprising the power amplifier 120, and transform an impedance seen at an output port 128 thereof. The power amplifier 120 of FIG. 1 includes an input matching network 121, and one or more inter-stage matching networks, such as 2nd inter-stage matching network 122 and 3rd inter-stage matching network 123. Each of these inter-stage matching networks have at least one voltage gate port and at least one voltage drain port, and together with the input matching network 121, comprise stages of the overall network 125 of multiple devices each having circuit elements through which signals flow through from one or more input ports to one or more output ports 128. FIG. 1 also shows an output matching and combining network 124 of the system comprising a power amplifier 120, which includes all or substantially all of the elements of the circuit(s) that embodies the harmonic matching network topology 110, as shown in, and discussed in further detail as to, FIG. 2 and FIG. 3.

Power amplifier 120 may be, in one embodiment of the present invention a Class-F power amplifier for use in high-frequency, high-power applications such as, for example, satellite communications and microwave power electronics systems, as noted above. One issue experienced in use of such Class-F power amplifiers is that design complexities produce signal imperfections known as harmonics, which are sinusoidal waves that propagate through networks of power amplifiers and other electrical circuits, where each such wave has a frequency that is an integer multiple of the fundamental frequency of the system in which they occur. Harmonics are produced by electronic equipment with non-linear loads within such systems and are a frequent cause of power quality problems, particularly for achieving specific performance characteristics such as a desired output power and PAE in such high-frequency or high-power systems, and/or for power amplifiers deployed in remote operating environments. Harmonics render Class F power amplifier designs difficult to implement at certain frequencies and using certain substrate materials on which the amplifiers are fabricated, and therefore need to be suppressed to the desired performance characteristics.

The harmonic matching network topology 110 suppresses higher-order harmonic powers for Class-F power amplifiers, and may be applicable to any other power electronics system in which such harmonics need to be suppressed. The harmonic matching network topology 110 accomplishes this in a tuning mechanism that suppresses higher-order harmonics propagating through the overall network 125, by introducing a short-circuit condition 132 to create one or more harmonic traps 134 (not shown) to suppress 2nd harmonic powers, and introducing an equivalent open-circuit condition to suppress 3rd harmonic powers. The plurality of open stubs 130 also convert an impedance of each associated transmission line having a value greater than 300 Ohms. The harmonic matching network topology 110 also includes an impedance transformer to ensure that the impedance seen at the output port 128, and following the suppression of the harmonic powers in the equivalent short-circuit condition 132 and open-circuit condition 142, is matched to the overall network 125.

Figure 2:
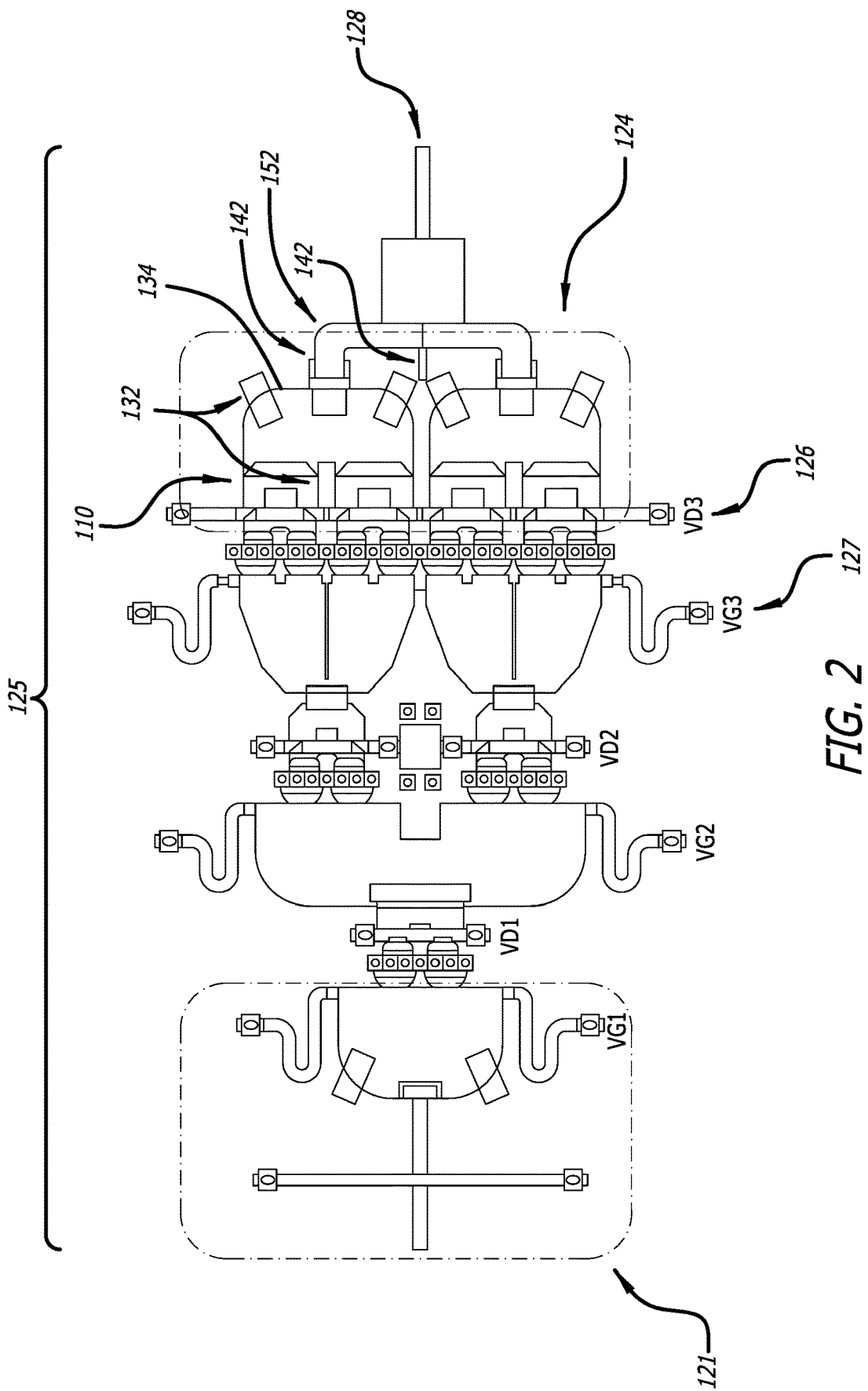
FIG. 2 is a circuit diagram for a power amplifier system illustrating elements of the harmonic matching network topology according to the present invention.
Figure 3:
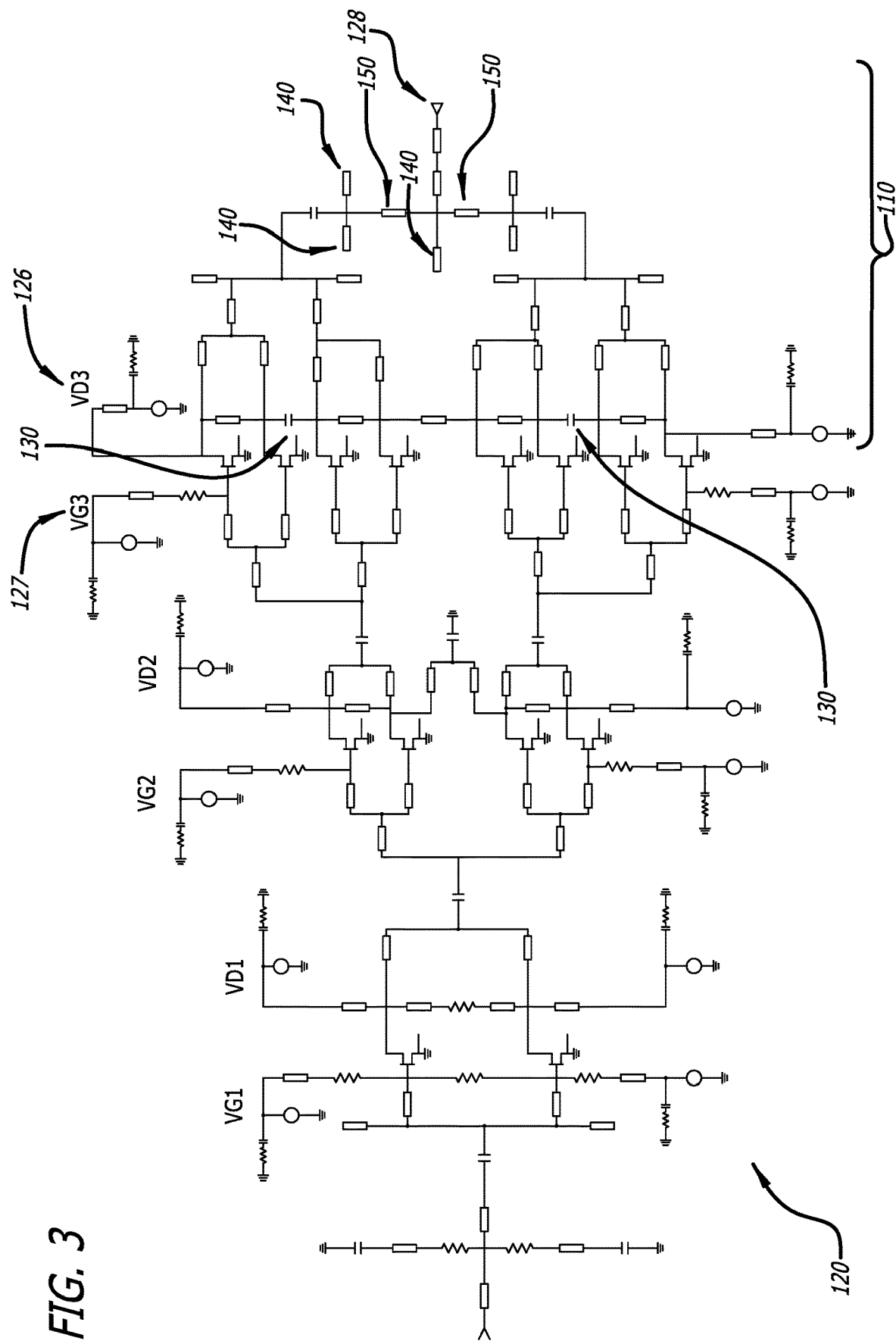
FIG. 3 is a further circuit diagram for a power amplifier system illustrating elements of the harmonic matching network topology according to the present invention.

FIG. 2 and FIG. 3 are circuit diagrams illustrating elements of the harmonic matching network topology 110 according to the present invention for introducing the short-circuit condition 132 and the equivalent open-circuit condition 142, and the impedance transformer 152. As indicated in FIG. 2 and FIG. 3, a plurality of coupled-line capacitors 130 introduce the short-circuit condition 132 for suppressing the 2nd harmonic power. Each coupled-line capacitor 130 is instantiated relative to a drain port 126 of the output matching network 124 and a gate port 127 of a preceding inter-stage matching network (for example, 3rd inter-stage matching network 123) within the overall network 125. This configuration has the effect of suppressing a 2nd harmonic through the overall network 125 by creating a $2^{nd}$ harmonic trap 134 at each coupled-line capacitor 130. In one embodiment of the present invention, two coupled-line capacitors 130 perform the 2nd harmonic suppression within the harmonic matching network topology 110, and each capacitor 130 has a value of 10 to 100 fF for V-band application. The harmonic matching network topology 110 also has three open stubs that introduce the open-circuit condition 142 equivalent to the short circuit condition 132 introduced by the coupled-line capacitors 132.

FIG. 2 and FIG. 3 also illustrate a layout of an exemplary 3-stage power amplifier 120 that includes the harmonic matching network topology 110 of the present invention. It is to be understood that many possible configurations of a power amplifiers 120 are possible and within both the scope of the application of the harmonic matching network topology 110, and the scope of the present invention, to achieve optimal output power and power added efficiency characteristics for applications within desired frequency bands. Accordingly, this disclosure is not to be limited to any one or specific design or configuration referenced herein. For example, power electronics systems are commonly designed so that signals from multiple power amplifiers and other integrated circuits comprising power amplifiers can be combined to provide more output power, or so that signals from power amplifiers can be divided into multiple signals. An n-way combiner therefore combines n signals into a single, common signal, while an n-way divider divides a single signal into n signals. Therefore, it should be noted that the same circuit can be a combiner or divider, depending on the direction of current flow, or alternatively whether the common or single signal is at the input port or at the output port. Power combiner circuits generally operate by introducing a characteristic impedance along transmission lines or pathways. A characteristic impedance is a measure of balance between opposing a change in current (inductance) and opposing a chance in voltage (capacitance). Transmission lines are the pathways along which current and voltage flow through a circuit, and can have many configurations in which a characteristic impedance is introduced, such as coaxial cables, waveguides, and lumped-element components such as capacitors, inductors, and resistors.

The power amplifier 120 may, as indicated in the systemic block diagram of FIG. 1, include multiple unit cells of transistors (such as, for example, GaN transistors) within the multi-stage power amplifier that enable power combining and power dividing capabilities through flow of signals propagating through the overall network 125, and the balancing of characteristic impedances seen at the input and output ports thereof. For example, two (6×50 µm) unit cells may couple the input matching network 121 and the $1^{st}$ inter-stage matching network 122, while four (6×50 µm) unit cells may couple the $1^{st}$ inter-stage matching network 122 with the 2nd inter-stage matching network 123. Further, eight (6×50 µm) unit cells may couple the $2^{nd}$ inter-stage matching network with the output matching network 124. A typical unit cell of a GaN transistor may include two sources, two gates, and one drain; regardless, a typical unit cell has several devices connected in parallel to increase the output power of the overall power amplifier 120 as voltage and current flow from stage to stage or network to network, and a typical power amplifier is comprised of several unit cells to generate higher output power, especially at higher frequencies.

In one embodiment of the present invention, the output matching network 124 of the power amplifier 120 includes two 4-way combiners represented by the 8 unit cells as indicated in FIG. 1, in which each of the 4-way combiners includes a coupled-line capacitor 130, and a 2-way combiner implemented with two sections of quarter-wavelength transmission lines 150. The two sections of transmission lines, which may for example be microstrip transmission lines, have distinctive characteristic impedances in series with components such as an inter-digitated blocking cap to further provide fundamental frequency tuning. In such a configuration, the drain and gate bias lines come through inductive lines loaded with DC bypass caps to terminate RF signals.

The tuning mechanism that generates the 2nd and 3rd harmonic terminations of the harmonic matching network topology 110 enables operation of the Class-F power amplifier at a desired amplifier output power given a desired power added efficiency. As shown in FIG. 2 and FIG. 3, the plurality of coupled-line capacitors 130 create the 2nd harmonic traps 134, while the plurality of open stubs 140 suppressing the 3rd harmonic generates a low impedance termination in the output matching network 124. Since device matching in power amplifier systems is bi-lateral, the configuration of the harmonics tuning mechanism comprising the coupled-line capacitors 130 and open stubs 140 at the device output matching network 124 is optimized with the 2nd inter-stage matching network 123, at the input to the output matching network 124, to improve the power added efficiency of the power amplifier 120.

As noted above, different configurations of power amplifiers 120 that include the harmonic network matching topology 110 are possible and included within the present invention. Additionally, each configuration may be realized with different performance characteristics within the desired frequencies while still achieving the specific performance characteristics desired for particular applications. For example, the input matching network 121 may be constructed with a 2-way combining transformer in series with a transmission line tuner. In-band gain flatness is achieved to within a 1 dB variation by incorporating such an input matching configuration. A resistor-loaded short stub ensures amplifier stability to be unconditional throughout the band from 0 to 80 GHz. For optimal output power and power added efficiency, the impedance transformer provided by the quarter-wavelength transmission lines 150 optimizes the full 3-stage matching network by transforming the 50 Ωhm load seen at the termination of the output port 128 to the optimum impedance obtained from the overall network 125. Still further, the 3rd inter-stage matching network 123 may be comprised of two 4-way dividers, two 2-way combiners and an inter-digitated capacitor. The 4-way combiners may be designed using quarter-wavelength transmission lines with chamfers to compensate for geometric asymmetries between outer and inner RF channels. The entire layout of the 3-stage amplifier may be fabricated on a wafer having an area of 3.8×2.2 mm$^2$ and produces a small signal gain of 25.4 to 26.4 dB across the 59 GHz to 65 GHz band. The output return loss is greater than 12 dB from 59 GHz to 65 GHz, where input return loss ranges between 10 dB and 16 dB. Unconditional stability of the power amplifier 120 is achieved with a K factor greater than 22 throughout the wide-band range from 0 GHz to 80 GHz.

The harmonic network matching topology 110 of the present invention enables a power amplifier 120 system having devices that operate as noted above in switching modes, where the current and voltage waveforms differ in phase by 180°. The 2nd and 3rd harmonic terminations resulting from the harmonic network matching topology 110 allow the designer to maximize amplifier efficiency without reducing output power in such a system. The plurality of coupled-line capacitors 130 adjacent to device drain ports (in the output matching network) and gate ports (in the 2nd inter-stage network) create LC-resonant circuits that serve as the 2nd harmonic traps 134. The 3rd harmonic terminations are generated by the plurality of open stubs (which are close to ¼ wavelength at the 3rd harmonic frequency) in the output matching network 124.

Figure 4:
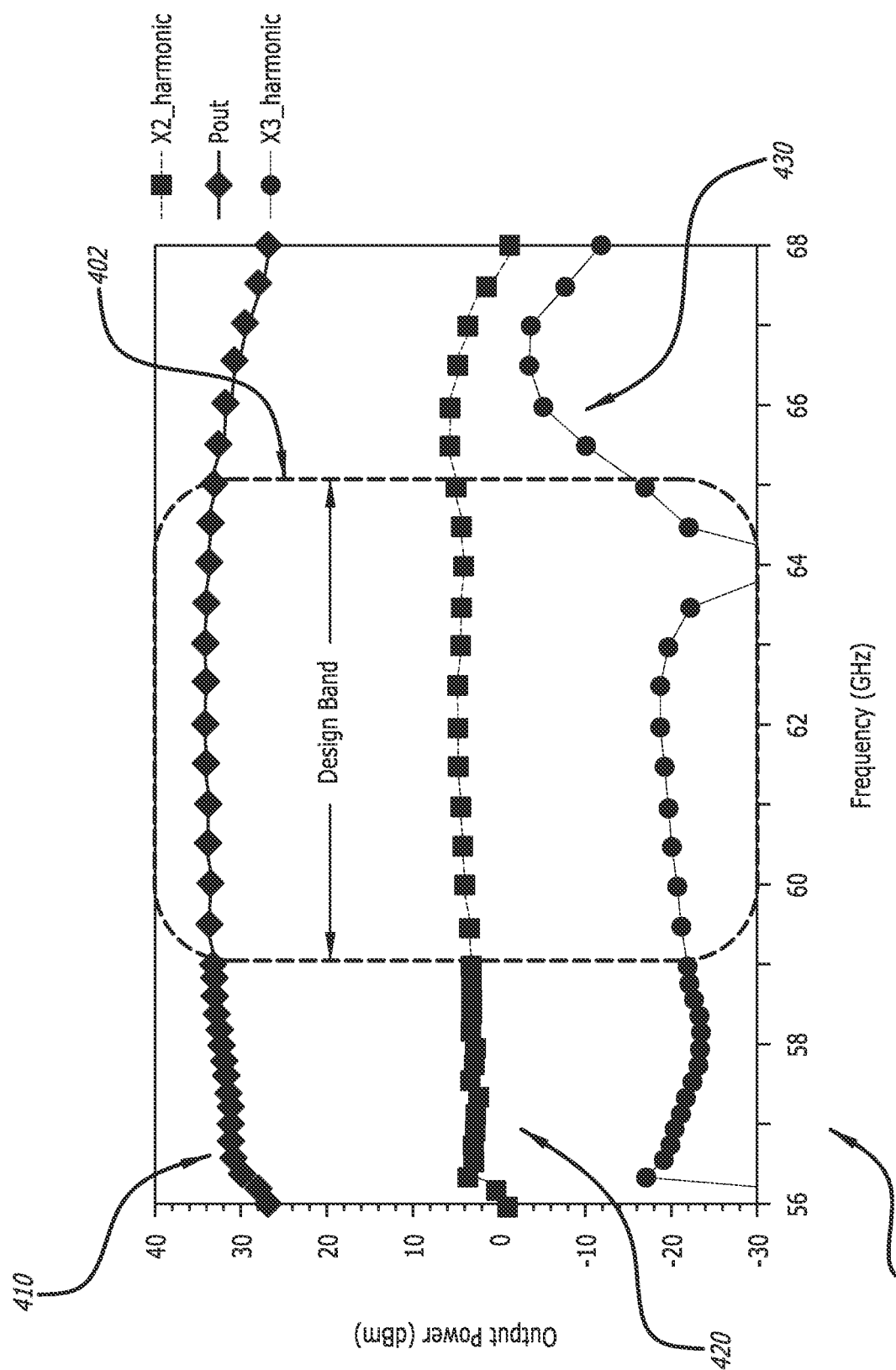
FIG. 4 is a plot of power output performance in a power amplifier that includes the harmonic matching network topology of the present invention.

FIG. 4 is a plot 400 of power output 410 in a power amplifier 120, illustrating the effect of harmonic suppression due to the harmonic network matching topology 110 of the present invention. FIG. 4 shows the 2nd harmonic power 420 and the 3rd harmonic power 430 are suppressed by more than 30 dBc and 50 dBc respectively within the design band of 59 to 65 GHz. The harmonic network matching topology 110 of the present invention therefore enables PAE of a power amplifier 120 to be maximized within a compact MMIC (Monolithic Microwave Integrated Circuit) layout. The harmonic network matching topology 110 may be realized in the design of V-band (59 GHz to 71 GHz) for 3-stage power amplifiers operating in switching modes, and enables such power amplifiers 120 to be built on 90 nm gallium nitride (GaN) and gallium nitride on silicon carbide (GaN-on-SiC) technology. Such a power amplifier design delivers an output power of more than 2 W with a maximum PAE of 30% over the band of 59 GHz to 65 GHz. For the band from 65 GHz to 71 GHz, the power amplifier design projects an output power more than 2.5 W with an associated PAE of more than 30% using the same harmonic matching network topology 110.

The systems and methods of the present invention may be implemented in many different performance and design environments. For example, they may be implemented in conjunction with any type of high-power RF or microwave circuit in which harmonic powers must be suppressed for achieving both high power output and high power added efficiency, and in any type of high-power RF or microwave circuit in which harmonic powers must be suppressed for operation within millimeter wave frequencies such as those between 30 GHz and 100 GHz. The present invention may be considered in many different ways; for example, in addition to comprising a harmonic matching network topology 110, the present invention may be considered as a power amplifier system that includes circuit elements comprising such a harmonic matching network topology 110, and may additionally may be considered as part of broader applications, including satellite communications systems, radar transmitters, electronic warfare systems, testing applications, and any other system in which high-frequency power amplification is desired. Therefore, it is to be understood that the present invention may further include system components and devices for implementing the harmonic matching network topology 110 in different hardware environments, in addition to the harmonic matching network topology 110 itself. The present invention may also be embodied or arranged on one or more printed circuit boards (PCBs), and may also include controller(s), CPUs, driver(s), heat sinks, and other components, assemblies, or sub-assemblies for functioning in the desired hardware environment.

The foregoing descriptions of embodiments of the present invention have been presented for the purposes of illustration and description. It is not intended to be exhaustive or to limit the invention to the precise forms disclosed. Accordingly, many alterations, modifications and variations are possible in light of the above teachings, may be made by those having ordinary skill in the art without departing from the spirit and scope of the invention. For example, the present invention may have many different configurations and many different components, and may be embodied within many different systems. Still further, transmission lines in the power amplifier 120 such as the quarter-wavelength transmission lines 150 may include at least one of microstrip transmission lines, stripline transmission lines, coaxial transmission lines, and waveguide transmission lines. It is therefore intended that the scope of the invention be limited not by this detailed description. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a sub-combination or variation of a sub-combination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the essential idea of the invention.

The invention claimed is:

1. A circuit, comprising:
a harmonic matching network topology, configured at an output matching network within an overall network of a power amplifier to create equivalent circuit conditions for terminating higher-order harmonic powers in the overall network, the harmonic matching network topology including
a plurality of coupled-line capacitors, each coupled-line capacitor coupled relative to a drain port of the output matching network and a gate port of a preceding inter-stage matching network within the overall network, to suppress a 2nd harmonic through the overall network by creating a plurality of $2^{nd}$ harmonic traps in the output matching network to form a $2^{nd}$ harmonic shorted-circuit condition,
a plurality of open stubs between the plurality of coupled-line capacitors and an output port of the overall network that introduce an equivalent $3^{rd}$ harmonic open-circuit condition to suppress a 3rd harmonic at each open stub and generate a low-impedance harmonic termination, and
a plurality of quarter-wavelength transmission lines associated with the plurality of open stubs at the output matching network to match the low-impedance harmonic termination to an output load, so that a load impedance at the output port of the overall network is 50 Ohms matched,
wherein the harmonic matching network topology introduces a harmonic suppression equal to or greater than 30 dBc for the $2^{nd}$ harmonic and a harmonic suppression of equal to or greater than 50 dBc for the 3rd harmonic.

2. The circuit of claim 1, wherein the power amplifier is a Class-F power amplifier fabricated on a GaN-based substrate.

3. The circuit of claim 1, wherein the power amplifier operates in a V-band frequency range of between 59 GHz and 71 GHz.

4. The circuit of claim 1, wherein the power amplifier operates in a frequency range of between 30 GHz and 100 GHz.

5. The circuit of claim 1, wherein the power amplifier produces an output power greater than 2.5 W and an associated power amplifier efficiency greater than 30%.

6. The circuit of claim 1, wherein the plurality of coupled-line capacitors create LC-resonant circuit conditions as the plurality of $2^{nd}$ harmonic traps between the drain ports.

7. The circuit of claim 1, wherein the plurality of quarter-wavelength transmission lines include one or more of lumped circuit elements at each transmission line.

8. A method of increasing performance of a Class F power amplifier, comprising:
tuning an output matching network of a power amplifier having an overall network, by introducing a $2^{nd}$ harmonic shorted-circuit condition to suppress a 2nd harmonic in a plurality of coupled-line capacitors, each coupled-line capacitor coupled relative to a drain port of an the output matching network and a gate port of a preceding inter-stage matching network, to create a plurality of $2^{nd}$ harmonic traps in the output matching network, and introducing an equivalent $3^{rd}$ harmonic open-circuit condition to suppress a 3rd harmonic at each open stub in a plurality of open stubs positioned between the plurality of coupled-line capacitors and an output port of the overall network, the plurality of open stubs generating a low-impedance harmonic termination; and
transforming an impedance of the overall network with a plurality of quarter-wavelength transmission lines associated with the plurality of open stubs at the output matching network to match the low-impedance harmonic termination to an output load, so that a load impedance at the output port of the overall is 50 Ohms matched,
wherein the plurality of coupled-line capacitors, the plurality of open stubs, and the plurality of quarter-wavelength transmission lines form a harmonic matching network topology at the output matching network of the power amplifier to terminate the higher-order harmonic powers comprising the $2^{nd}$ harmonic and the $3^{rd}$ harmonic propagating through the overall network, and wherein the harmonic matching network topology introduces a harmonic suppression equal to or greater than 30 dBc for the $2^{nd}$ harmonic and a harmonic suppression of equal to or greater than 50 dBc for the 3rd harmonic.

9. The method of claim 8, wherein the power amplifier is a Class-F power amplifier fabricated on a GaN-based substrate.

10. The method of claim 8, wherein the power amplifier operates in a V-band frequency range of between 59 GHz and 71 GHz.

11. The method of claim 8, wherein the power amplifier operates in a frequency range of between 30 GHz and 100 GHz.

12. The method of claim 8, wherein the power amplifier produces an output power greater than 2.5 W and an associated power amplifier efficiency greater than 30%.

13. The method of claim 8, wherein the transforming an impedance of the overall network further comprises converting an impedance of each associated transmission line into an impedance value greater than 300 Ohms.

14. The method of claim 8, wherein the tuning the output matching network of the power amplifier further comprises creating LC-resonant circuit conditions as the plurality of $2^{nd}$ harmonic traps between the drain ports.

15. A topology for increasing performance of a Class F power amplifier, comprising:
a tuner configured at an output matching network of a power amplifier having an overall network, the tuner comprised of plurality of coupled-line capacitors each coupled-line capacitor coupled relative to a drain port of the output matching network and a gate port of a preceding inter-stage matching network, the plurality of coupled-line capacitors introducing a $2^{nd}$ harmonic shorted-circuit condition for a 2nd harmonic to create a plurality of $2^{nd}$ harmonic traps in the output matching network, and a plurality of open stubs positioned between the plurality of coupled-line capacitors and an output port of the overall network, the plurality of open stubs introducing an equivalent $3^{rd}$ harmonic open-circuit condition to suppress a 3rd harmonic at each open stub, the plurality of open stubs generating a low-impedance harmonic termination; and
an impedance transformer configured at the output matching network and comprised of a plurality of quarter-wavelength transmission lines associated with the plurality of open stubs at the output matching network to match the low-impedance harmonic termination to an output load, so that a load impedance at the output port of the overall network is 50 Ohms matched,
wherein the plurality of coupled-line capacitors, the plurality of open stubs, and the plurality of quarter-wavelength transmission lines form a harmonic matching network topology at the output matching network of the power amplifier to terminate the higher-order harmonic powers comprising the 2nd harmonic and the 3rd harmonic propagating through the overall network, and wherein the harmonic matching network topology introduces a harmonic suppression equal to or greater than 30 dBc for the $2^{nd}$ harmonic and a harmonic suppression of equal to or greater than 50 dBc for the 3rd harmonic.

16. The topology of claim 15, wherein the power amplifier is fabricated on a GaN-based substrate.

17. The topology of claim 15, wherein the power amplifier operates in a V-band frequency range of between 59 GHz and 71 GHz.

18. The topology of claim 15, wherein the power amplifier operates in a frequency range of between 30 GHz and 100 GHz.

19. The topology of claim 15, wherein the power amplifier produces an output power greater than 2.5 W and an associated power amplifier efficiency greater than 30%.

20. The topology of claim 15, wherein the plurality of coupled-line capacitors create LC-resonant circuit conditions as the plurality of $2^{nd}$ harmonic traps between the drain ports.

21. The topology of claim 15, wherein the plurality of quarter-wavelength transmission lines include one or more of lumped circuit elements at each transmission line.

* * * * *